US012327723B2

United States Patent
Pan et al.

(10) Patent No.: US 12,327,723 B2
(45) Date of Patent: Jun. 10, 2025

(54) PASSIVE CAP FOR GERMANIUM-CONTAINING LAYER

(71) Applicant: Taiwan Semiconductor Manufacturing Company, Ltd., Hsinchu (TW)

(72) Inventors: Lung Yuan Pan, Hsinchu (TW); Chen-Hao Chiang, Jhongli (TW); Chih-Ming Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 433 days.

(21) Appl. No.: 17/683,567

(22) Filed: Mar. 1, 2022

(65) Prior Publication Data

US 2023/0282476 A1    Sep. 7, 2023

(51) Int. Cl.
| | |
|---|---|
| H01L 21/02 | (2006.01) |
| H01L 21/762 | (2006.01) |
| H10F 30/223 | (2025.01) |
| H10F 71/00 | (2025.01) |
| H10F 77/14 | (2025.01) |

(52) U.S. Cl.
CPC .... *H01L 21/02532* (2013.01); *H01L 21/0262* (2013.01); *H01L 21/76251* (2013.01); *H10F 30/223* (2025.01); *H10F 71/1212* (2025.01); *H10F 77/147* (2025.01)

(58) Field of Classification Search
CPC ............. H01L 21/7624; H01L 31/1808; H01L 31/105; H01L 31/035281; H01L 21/76251; H01L 21/0262; H01L 21/02532; H01L 21/76224; H10F 30/223; H10F 71/1212; H10F 71/1224; H10F 77/147;
(Continued)

(56) References Cited

U.S. PATENT DOCUMENTS

| | | | | |
|---|---|---|---|---|
| 2009/0108384 | A1* | 4/2009 | Assefa | ................ H01L 31/0232 |
| | | | | 438/69 |
| 2012/0126357 | A1* | 5/2012 | Kim | ....................... H01L 31/18 |
| | | | | 257/E31.011 |

(Continued)

OTHER PUBLICATIONS

Vidyasagar, Dattaraj. (2019). Use of Silicon over Germanium in the Manufacturing of Semiconductor in LSI & VLSI Technology. 10.13140/RG.2.2.31045.81121. Abstract provided in the Office action (Year: 2019).*

(Continued)

*Primary Examiner* — Mary A Wilczewski
*Assistant Examiner* — Nathan Pridemore
(74) *Attorney, Agent, or Firm* — Eschweiler & Potashnik, LLC

(57) ABSTRACT

In some embodiments, the present disclosure relates to a semiconductor device, including a substrate including a first semiconductor material and a semiconductor layer extending into an upper surface of the substrate and including a second semiconductor material with a different band gap than the first semiconductor material. The semiconductor device also includes a passive cap including a first dielectric material and disposed along the upper surface of the substrate and on opposite sides of the semiconductor layer, and a photodetector in the semiconductor layer. The first dielectric material includes silicon nitride.

20 Claims, 14 Drawing Sheets

(58) Field of Classification Search
CPC ....... H10F 19/30; A23B 40/10; H10D 10/461; H10D 44/462; H10D 64/514
See application file for complete search history.

(56) References Cited

U.S. PATENT DOCUMENTS

| | | | | |
|---|---|---|---|---|
| 2016/0247841 | A1* | 8/2016 | Cheng | H01L 31/105 |
| 2020/0098773 | A1* | 3/2020 | Kaneko | H10B 41/35 |
| 2021/0217912 | A1* | 7/2021 | Jacob | H01L 31/105 |
| 2022/0065692 | A1* | 3/2022 | Baudot | G01J 1/42 |
| 2022/0131017 | A1* | 4/2022 | Chiang | H01L 31/0203 |
| 2022/0344523 | A1* | 10/2022 | Chowdhury | H01L 31/02327 |

OTHER PUBLICATIONS

Film Properties of Low-k Silicon Nitride Films Formed by Hexachlorodisilane and Ammonia (Year: 2000).*
Joshi et al. "LPCVD and PECVD Silicon Nitride for Microelectronics Technology" Indian Journal of Engineering and Material Sciences, vol. 7, Oct.-Dec. 2000, pp. 303-309. Published Oct. 2000.

* cited by examiner

PASSIVE CAP FOR GERMANIUM-CONTAINING LAYER

BACKGROUND

Many modern-day electronic devices, such as digital cameras and video cameras, contain image sensors to convert optical images to digital data. To achieve this, an image sensor comprises photodiodes configured to capture optical signals (e.g., light) and convert it to digital data (e.g., a digital image). Germanium is better at absorbing higher wavelengths of light than silicon, making germanium a more practical photodiode material than silicon for high wavelength applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
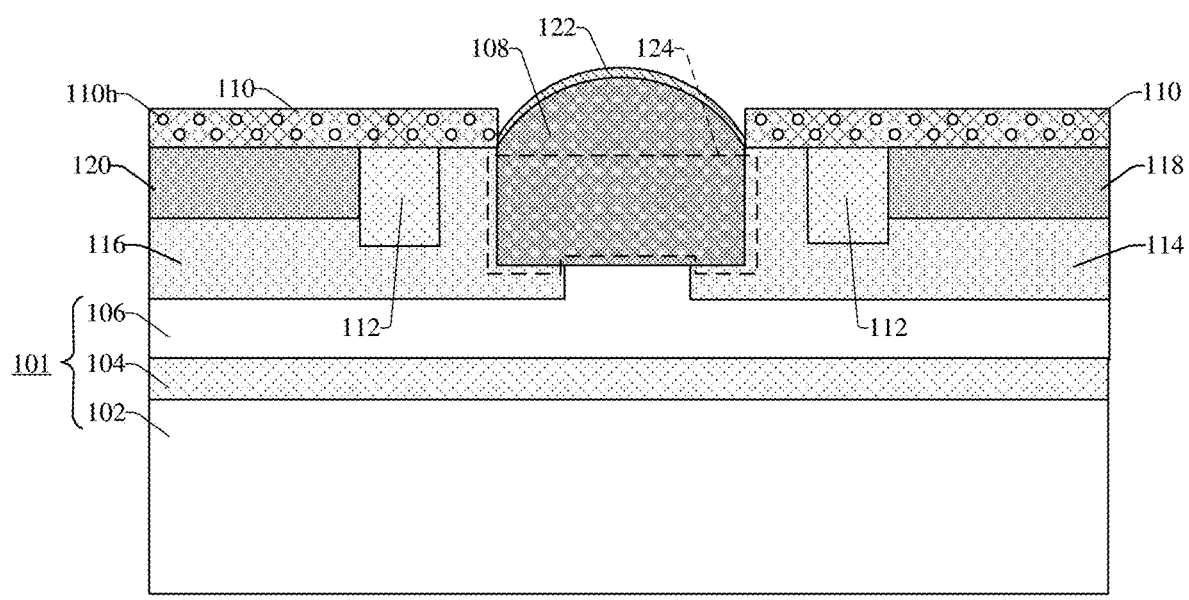
FIG. 1 illustrates a cross-sectional view of some embodiments of a semiconductor device in which a passive cap comprises silicon nitride and hydrogen and has opposing sidewalls at a boundary of a semiconductor layer inset into a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device comprises a photodetector defined by a semiconductor layer and doped regions of a substrate. The semiconductor layer extends into an upper surface of the substrate. The semiconductor layer comprises a first semiconductor material (e.g., germanium (Ge)) and the substrate comprises a second semiconductor material (e.g., silicon (Si)) that is different than the first semiconductor material. The photodetector is configured to absorb one or more photons and generate electrical signals corresponding to the one or more photons.

To form the semiconductor device, the substrate is doped to form the doped regions. A trench is then etched into the substrate according to a passive cap, and the semiconductor layer is deposited to fill the trench. The semiconductor layer preferentially deposits on the substrate compared to the passive cap and hence deposits at a faster rate on the substrate compared to the passive cap. Partial deposition of the semiconductor layer onto the passive cap could potentially lead to electrical shorting and/or leakage between neighboring photodetectors. Thus, during deposition of the semiconductor layer, a co-flow etch process is performed to remove excess semiconductor material of the semiconductor layer from the passive cap. When performed at a high rate, the co-flow etch process can negatively affect the throughput and growth rate of the semiconductor layer in the trench.

The passive cap may comprise silicon dioxide because silicon dioxide has a high level of growth suppression in comparison to other suitable materials. Thus, the co-flow etch process can be performed at a sufficiently low rate that does not significantly affect throughput or growth rate of the semiconductor layer in the trench. A silicon dioxide passive cap, however, can cause oxygen contamination in the semiconductor layer upon deposition of the semiconductor layer. For example, interstitial oxygen in germanium is an efficient trap for mobile vacancies and hence can lead to the formation of a leakage path. Hence, to the extent that the semiconductor layer is germanium, oxygen contamination can cause leakage current, hindering the performance of the photodetector.

In various embodiments, the present application is directed toward a semiconductor device comprising a substrate and a photodetector having a semiconductor layer extending into an upper surface of the substrate. The substrate comprises a first semiconductor material (e.g., Si), and the photodetector comprises a second semiconductor material (e.g., Ge) that is different than the first semiconductor material. To form the semiconductor device, the substrate is doped to form doped regions. A trench is then etched into the substrate according to a passive cap, and the semiconductor layer is deposited to fill the trench. To prevent oxygen contamination of the semiconductor layer during deposition, the passive cap comprises silicon nitride. By preventing oxygen contamination, leakage current is decreased and the performance of the semiconductor device is improved as compared to a semiconductor device having a passive cap comprising silicon dioxide.

During deposition of the semiconductor layer, a co-flow etch process is performed to remove excess semiconductor material of the semiconductor layer from the passive cap. While a silicon nitride passive cap prevents oxygen contamination of the semiconductor layer, silicon nitride does not have a high level of growth suppression in comparison to silicon dioxide. Thus, to perform the co-flow etch process at a sufficiently low rate, such that excess semiconductor material of the semiconductor layer from the passive cap is removed without negatively affecting the throughput or the growth rate, the passive cap further comprises hydrogen. The materials of the passive cap may correspondingly form Si—H bonds, giving the passive cap a higher level of growth suppression in comparison to a passive cap comprising only silicon nitride. By suppressing growth of the semiconductor layer atop the passive cap, the co-flow etch process can be performed at a sufficiently low rate so as to remove excess semiconductor material of the semiconductor layer from the passive cap without negatively impacting throughput, thus preventing leakage current and/or electrical shorting from the photodetector to neighboring photodetectors.

FIG. 1 illustrates a cross-sectional view 100 of some embodiments of a semiconductor device comprising a semiconductor layer 108 disposed between sidewalls of a passive cap 110 comprising silicon nitride and hydrogen. The semiconductor layer 108 extends into an upper surface of a substrate 101. In some embodiments, the substrate 101 is a silicon-on-insulator (SOI) substrate and comprises a first semiconductor layer 102 and a second semiconductor layer 106 vertically separated by an insulating layer 104. In further embodiments, a bottommost surface of the semiconductor layer 108 is above the insulating layer 104.

The semiconductor layer 108 is or comprises a semiconductor material (e.g., germanium (Ge), Silicon (Si), indium gallium arsenide (InGaAs), or the like). In some embodiments, to the extent that the semiconductor layer 108 is or comprises germanium (Ge), the semiconductor layer 108 may be alternatively referred to as a germanium-containing layer. In some embodiments, the semiconductor material of the semiconductor layer 108 is intrinsic. In some embodiments, the semiconductor material of the semiconductor layer 108 is lightly doped. The second semiconductor layer 106 comprises a semiconductor material different than the semiconductor material of the semiconductor layer 108 (e.g., silicon (Si) or some other suitable material). In some embodiments, the first semiconductor layer 102 comprises a semiconductor material different than the semiconductor material of the second semiconductor layer 106 (e.g., germanium, silicon, or some other suitable semiconductor material). In some embodiments, the semiconductor material of the semiconductor layer 108 has a wider band gap than the semiconductor material of the substrate 101 so as to better absorb higher wavelengths of light.

The semiconductor layer 108 has an upper surface that is convex and that arcs between opposite sidewalls of the semiconductor layer 108. In other words, the upper surface of the semiconductor layer 108 is rounded. In some embodiments, the upper surface of the semiconductor layer 108 arcs continuously between the opposite sidewalls of the semiconductor layer 108. In further embodiments, the upper surface of the semiconductor layer 108 is an uppermost surface of the semiconductor layer 108. In some embodiments, the upper surface of the semiconductor layer 108 is above the upper surface of the substrate 101. In alternative embodiments, the upper surface of the semiconductor layer 108 is below the upper surface of the substrate 101. In some embodiments, the passive cap 110 is disposed on opposite sides of the semiconductor layer 108. In some embodiments, the passive cap 110 comprises a pair of opposing sidewalls respectively on opposite sides of the semiconductor layer 108 and at a boundary of the semiconductor layer 108. In some embodiments, the pair of opposing sidewalls overlie and are arranged edge-to-edge with respective sidewalls of the substrate 101. In some embodiments, the passive cap 110 directly contacts the substrate 101.

In some embodiments, the passive cap 110 comprises a different material than the insulating layer 104. In some embodiments, the passive cap 110 may be or comprise, for example, silicon nitride, and the insulating layer 104 may be or comprise, for example, silicon dioxide or some other suitable oxide material. Since the passive cap 110 comprises silicon nitride, the passive cap 110 is not a source of oxygen and does not contaminate the semiconductor layer 108 during fabrication of the semiconductor device, thereby decreasing leakage current and improving the performance of the semiconductor device as compared to a semiconductor device having a passive cap comprising an oxide. In some embodiments, the material of the passive cap 110 has a smaller band gap than the material of the insulating layer 104. In some embodiments, the material of the passive cap 110 has a larger dielectric constant than the material of the insulating layer 104. In some embodiments, the passive cap 110 comprises opposing sidewalls at a boundary of the semiconductor layer 108.

Since the passive cap 110 comprises silicon nitride, oxygen does not contaminate the semiconductor layer 108 during fabrication of the semiconductor device. However, silicon nitride does not have a high level of growth suppression in comparison to alternative passive cap materials (e.g., silicon dioxide). During fabrication, a co-flow etch process may be performed while forming the semiconductor layer 108 to remove excess semiconductor material of the semiconductor layer 108. To perform the co-flow etch process at a sufficiently low rate, such that excess semiconductor material of the semiconductor layer 108 from the passive cap 110 is removed without negatively affecting throughput, the passive cap 110 further comprises hydrogen 110$h$. The materials of the passive cap 110 may correspondingly form stable bonds (e.g., Si—H bonds), giving the passive cap 110 a higher level of growth suppression in comparison to a passive cap comprising only silicon nitride. For example, to the extent that the semiconductor layer 108 is germanium and the passive cap 110 is hydrogen-rich silicon nitride, the hydrogen-rich silicon nitride may suppress germanium nucleation on the passive cap 110 and may hence reduce germanium growth on the passive cap 110. In some embodiments, an atomic percentage of hydrogen 110$h$ in the passive cap 110 is greater than about 10% or some other suitable value. In some embodiments, if the atomic percentage of hydrogen 110$h$ in the passive cap 110 is too low (e.g., less than about 10%), the semiconductor material of the semiconductor layer 108 may be at least partially deposited onto the passive cap 110 during fabrication of the semiconductor device, which may potentially lead to electrical shorting and/or leakage between neighboring photodetectors. Alternatively, the co-flow etch process may be performed at a sufficiently high rate so as to remove the semiconductor material of the semiconductor layer 108 from the passive cap 110, although this negatively affects throughput. In some embodiments, a concentration of hydrogen 110h in the passive cap 110 increases from a bottom surface of the passive cap 110 to a top surface of the passive cap 110. In other embodiments, the concentration of hydrogen 110h in the passive cap 110 is constant throughout a thickness of the passive cap 110.

A p-type drift well 114 is disposed in the substrate 101. In some embodiments, the p-type drift well 114 is disposed in the second semiconductor layer 106 and over the insulating layer 104. In further embodiments, the p-type drift well 114 is vertically spaced from the insulating layer 104. In yet further embodiments, the p-type drift well 114 is vertically spaced from an upper surface of the substrate 101. The p-type drift well 114 has a concentration of p-type dopants (e.g., boron (B), gallium (Ga), etc.).

An n-type drift well 116 is disposed in the substrate 101 and laterally spaced from the p-type drift well 114. In some embodiments, the n-type drift well 116 is disposed in the second semiconductor layer 106 and over the insulating layer 104. In further embodiments, the n-type drift well 116 is vertically spaced from the insulating layer 104. In yet further embodiments, the n-type drift well 116 is vertically spaced from an upper surface of the substrate 101. The n-type drift well 116 has a concentration of n-type dopants (e.g., phosphorus (P), arsenic (As), etc.).

A shallow trench isolation (STI) structure 112 is disposed in the substrate 101. In some embodiments, the STI structure 112 is disposed in the second semiconductor layer 106 and over the insulating layer 104. In further embodiments, the STI structure 112 is vertically spaced from the insulating layer 104. In yet further embodiments, the STI structure 112 is at least partially disposed in the p-type drift well 114 and/or at least partially disposed in the n-type drift well 116. For example, the STI structure 112 extends vertically into the substrate 101 to a position disposed in the p-type drift well 114 and/or the n-type drift well 116. In some embodiments, the STI structure 112 may be or comprise, for example, a nitride (e.g., silicon nitride), an oxide (e.g., silicon dioxide), some other suitable dielectric material(s), or a combination of the foregoing. In some embodiments, the STI structure 112 and the passive cap 110 are or comprise a same material. In some embodiments, the STI structure 112 comprises hydrogen (not shown).

A p+ contact region 118 is disposed in the substrate 101. The p+ contact region 118 is electrically coupled to the p-type drift well 114. In some embodiments, the p+ contact region 118 is disposed in the second semiconductor layer 106 and over the insulating layer 104. In further embodiments, the p+ contact region 118 extends vertically from an upper surface of the second semiconductor layer 106 and at least partially into the p-type drift well 114. The p+ contact region 118 has a same doping type as the p-type drift well 114. In some embodiments, the p+ contact region 118 has a concentration of p-type dopants that is greater than that of the p-type drift well 114.

An n+ contact region 120 is disposed in the substrate 101. The n+ contact region 118 is electrically coupled to the n-type drift well 116. In some embodiments, the n+ contact region 120 is disposed in the second semiconductor layer 106 and over the insulating layer 104. In further embodiments, the n+ contact region 120 extends vertically from an upper surface of the substrate 101 and at least partially into the n-type drift well 116. The n+ contact region 120 is a region of the second semiconductor layer 106. The n+ contact region 120 has a same doping type as the n-type drift well. In some embodiments, the n+ contact region 120 has a concentration of n-type dopants that is greater than that of the n-type drift well 116.

A capping layer 122 is disposed on an upper surface of the semiconductor layer 108. The capping layer 122 is configured to protect the semiconductor layer 108 during fabrication of the semiconductor device. In alternative embodiments, the capping layer 122 lines the upper surface of the semiconductor layer 108 and a portion of an upper surface of the passive cap 110. The capping layer 122 at least partially covers the upper surface of the semiconductor layer 108. In some embodiments, the capping layer 122 completely covers the upper surface of the semiconductor layer 108. In some embodiments, the capping layer 122 is a conformal layer. In further embodiments, the capping layer 122 has an arced upper surface that corresponds to an arced upper surface of the semiconductor layer 108. The capping layer 122 may be or comprise, for example, a nitride (e.g., silicon nitride), a semiconductor material (e.g., silicon, a silicon-germanium alloy, or the like), an oxide (e.g., silicon dioxide), or the like. In some embodiments in which the capping layer 122 is a semiconductor material, the capping layer 122 may have different chemical composition than the semiconductor layer 108. For example, the semiconductor layer 108 is germanium and the capping layer 122 is silicon.

The p-type drift well 114, the semiconductor layer 108, and the n-type drift well 116 may collectively define or surround a photodetector 124. In some embodiments, the photodetector 124 may be, for example, a p-i-n photodiode or some other suitable type of photodetector (e.g., an avalanche photodiode, a p-n photodiode, or the like). When a photon of sufficient energy strikes the semiconductor layer 108, an electron-hole pair is created. An electrical bias is provided to the photodetector 124 via the p+ contact region 118 and/or the n+ contact region 120, producing an electric field that causes holes (p−) to move toward the p+ contact region 118 and electrons (n−) to move toward the n+ contact region 120, producing a photocurrent. Measurements can be made by monitoring deviations in current flow from the p+ contact region 118 to the n+ contact region 120.

Figure 2A:
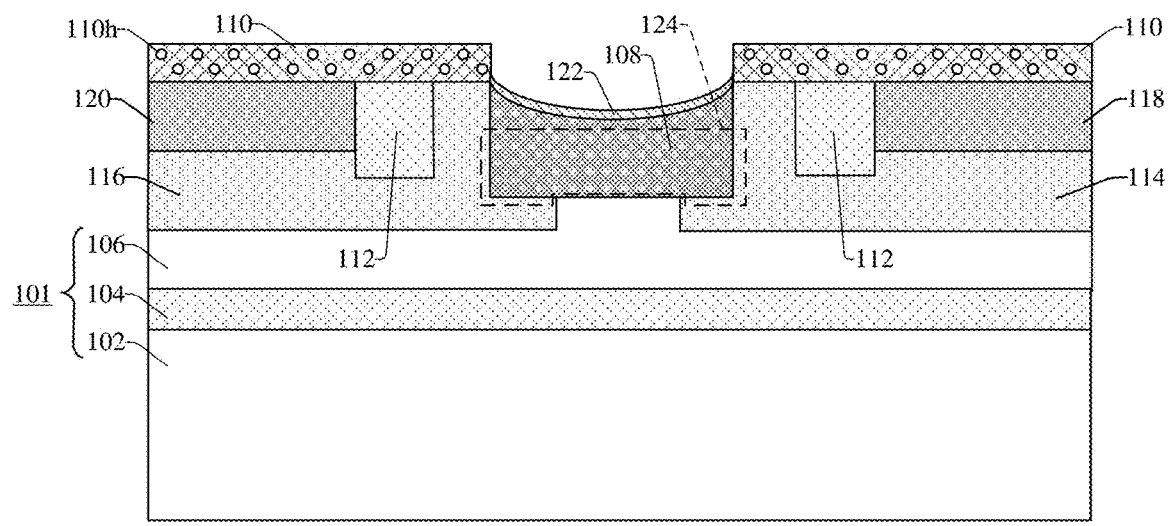
FIG. 2A illustrates a cross-sectional view of some alternative embodiments of the semiconductor device of FIG. 1 in which the semiconductor layer has a concave top surface.

FIG. 2A illustrates a cross-sectional view 200A of some alternative embodiments of the semiconductor device of FIG. 1 in which the semiconductor layer 108 is concave. The semiconductor layer 108 has an upper surface that is concave and that arcs between opposite sidewalls of the semiconductor layer 108. In other words, the upper surface of the semiconductor layer 108 is rounded. In some embodiments, the upper surface of the semiconductor layer 108 is below the upper surface of the passive cap 110. In further embodiments, the upper surface of the semiconductor layer 108 is below the upper surface of the substrate 101. In some embodiments, the capping layer 122 has an arced upper surface that corresponds to an arced upper surface of the semiconductor layer 108. In some embodiments, the upper surface of the capping layer 122 is below the upper surface of the passive cap 110.

Figure 2B:
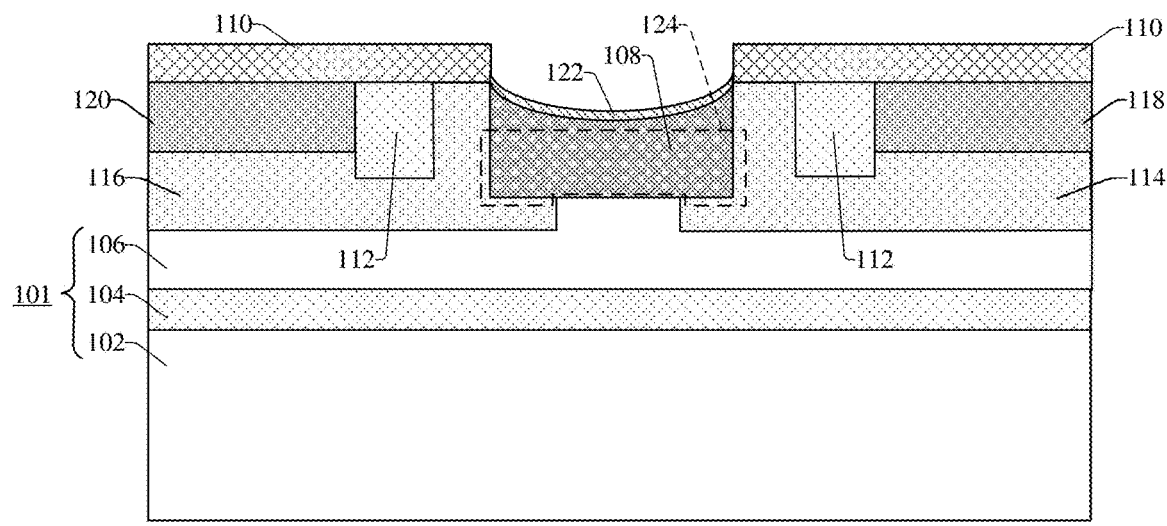
FIG. 2B illustrates a cross-sectional view of some alternative embodiments of the semiconductor device of FIG. 2A in which the passive cap does not comprise hydrogen.

FIG. 2B illustrates a cross-sectional view of some alternative embodiments of the semiconductor device of FIG. 2A in which the hydrogen 110h of the passive cap 110 is omitted. Since the hydrogen 110h is omitted from the passive cap 110, a co-flow etch process is performed during fabrication of the semiconductor device to remove the semiconductor material of the semiconductor layer 108 from the passive cap 110. The co-flow etch process may, for example, be concurrently performed while depositing the semiconductor material of the semiconductor layer 108. The etch removes the semiconductor material from the passive cap 110 at a rate that is the same as or faster than the rate at which the semiconductor material is deposited on the passive cap 110, thereby preventing electrical shorting between neighboring photodetectors. As a consequence of this etching, the growth rate of the semiconductor layer 108 and hence manufacturing throughput are lower. Further, the semiconductor layer 108 may have a concave upper surface.

Figure 3A:
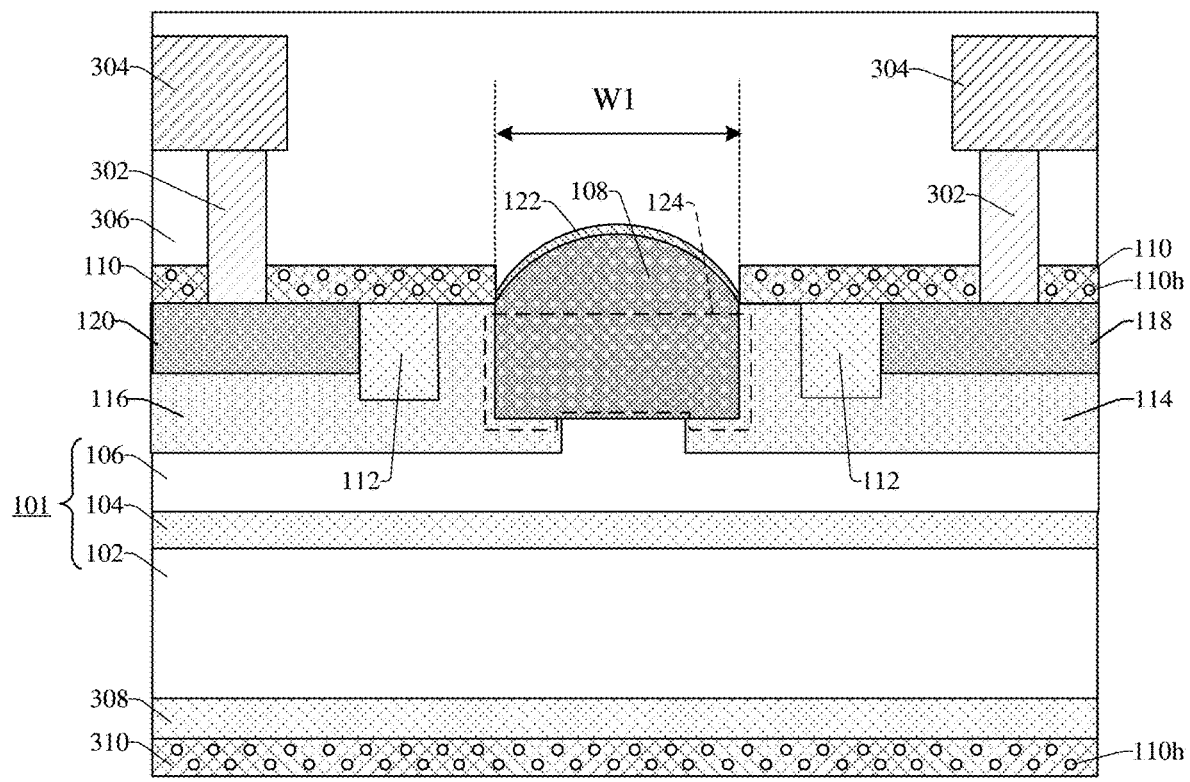
FIG. 3A illustrates a cross-sectional view of some more detailed embodiments of the semiconductor device of FIG. 1.

FIG. 3A illustrates a cross-sectional view 300 of some more detailed embodiments of the semiconductor device of FIG. 1. In some embodiments, the cross-sectional view 300 is taken across line A-A' of FIG. 3B.

An interconnect dielectric structure 306 is disposed over the substrate 101, the STI structure 112, the semiconductor layer 108, the passive cap 110, and the capping layer 122. The interconnect dielectric structure 306 comprises one or more stacked interlayer dielectric (ILD) and intermetal dielectric (IMD) layers, which may respectively comprise a low-k dielectric (e.g., a dielectric material with a dielectric constant less than about 3.9), an oxide (e.g., (SiO2)), or the like. In some embodiments, an uppermost surface of the interconnect dielectric structure 306 is substantially planar.

A plurality of conductive contacts 302 (e.g., metal contacts) and a plurality of conductive lines 304 (e.g., metal lines) are disposed in the interconnect dielectric structure 306. In some embodiments, the conductive contacts 302 and the conductive lines 304 are part of an interconnect structure embedded in the interconnect dielectric structure 306. Although not shown, it will be appreciated that any number of other conductive features (e.g., conductive lines and conductive vias) may be disposed over and electrically coupled to the conductive contacts 302 and the conductive lines 304.

The conductive contacts 302 extend vertically from the substrate 101 to the conductive lines 304, providing a path on which the photocurrent may travel from the substrate 101 to the conductive lines 304. For example, a first conductive contact of the conductive contacts 302 extends vertically from the p+ contact region 118 to a first conductive line of the conductive lines 304, and a second conductive contact of the conductive contacts 302 extends vertically from the n+ contact region 120 to a second conductive line of the conductive lines 304. The p+ contact region 118 provides a low resistance path between the first conductive contact of the conductive contacts 302 and the p-type drift well 114. The n+ contact region 120 provides a low resistance path between the second conductive contact of the conductive contacts 302 and the n-type drift well 116. The conductive contacts 302 may be or comprise, for example, tungsten (W), copper (Cu), aluminum (Al), some other conductive material, or a combination of the foregoing. The conductive lines 304 may be or comprise, for example, Cu, Al, gold (Au), silver (Ag), some other conductive material, or a combination of the foregoing.

A first backside insulating layer 308 is disposed along a lower surface of the substrate 101. The first backside insulating layer 308 is configured to prevent dopant outgas from the substrate 101. In some embodiments, the first backside insulating layer 308 may be or comprise, for example, silicon dioxide or some other suitable oxide material(s).

A second backside insulating layer 310 is disposed along a lower surface of the first backside insulating layer 308. In some embodiments, the second backside insulating layer 310 is configured to prevent dopant outgassing from the substrate 101. In some embodiments, the second backside insulating layer 310 may be or comprise, for example, silicon nitride or some other suitable material(s). In some embodiments, during fabrication, the second backside insulating layer 310 is formed simultaneously with the passive cap 110 and thus comprises a same material as the passive cap 110. In further embodiments, the second backside insulating layer 310 comprises hydrogen 110$h$. In some embodiments, an atomic percentage of hydrogen 110$h$ in the second backside insulating layer 310 is greater than 10%.

In some embodiments, the semiconductor layer 108 has a width W1 ranging from approximately 0.5 micrometers to approximately 15 micrometers, from approximately 0.5 micrometers to approximately 5 micrometers, from approximately 5 micrometers to approximately 15 micrometers, or some other suitable value.

Figure 3B:
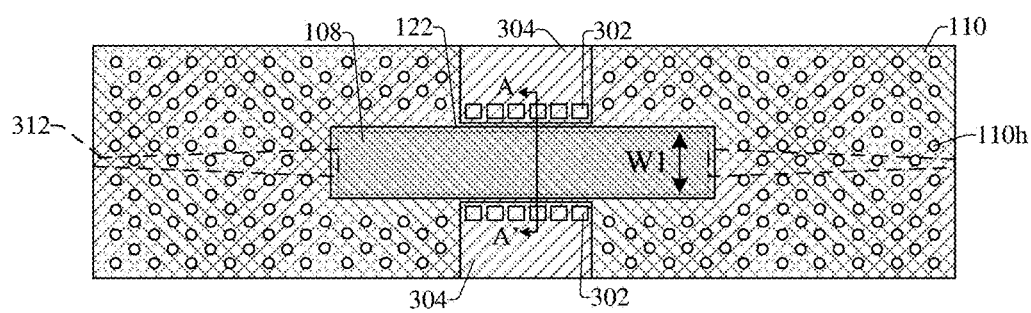
FIG. 3B illustrates a top layout view of some embodiments of the semiconductor device of FIG. 3A.

FIG. 3B illustrates a top layout view 300B of some embodiments of the semiconductor device of FIG. 3A. A waveguide structure 312 is disposed on opposing ends of the semiconductor layer 108 and is configured to guide one or more photons into the semiconductor layer 108.

In some embodiments, the waveguide structure 312 is or comprises a semiconductor material (e.g., silicon, germanium, or the like). The semiconductor material of the waveguide structure 312 may be different than that of the semiconductor layer 108. For example, the waveguide structure 312 is silicon, and the semiconductor layer 108 is germanium. In some embodiments, the waveguide structure 312 comprises a single semiconductor material (e.g., silicon). In further embodiments, the waveguide structure 312 is a portion of the substrate 101. In yet further embodiments, the waveguide structure 312 is a portion of the second semiconductor layer 106. In other words, the waveguide structure 312 may be defined by a portion of the second semiconductor layer 106. In alternative embodiments, the waveguide structure 312 may be disposed over the substrate 101 and the passive cap 110.

Figure 4:
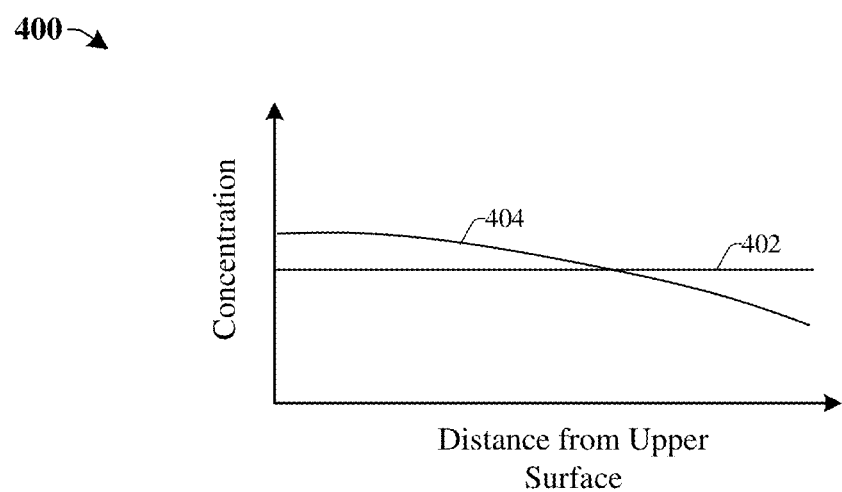
FIG. 4 illustrates a graphical representation of some embodiments of a doping profile of hydrogen in passive caps comprising silicon nitride and hydrogen.

FIG. 4 illustrates a graphical representation 400 of some embodiments of a doping profile of hydrogen in passive caps comprising silicon nitride and hydrogen. In some embodiments, any of the passive caps may correspond to the passive cap 110 of FIG. 1. A first curve 402 describes a passive cap in which hydrogen is added during deposition. A second curve 404 describes a passive cap in which hydrogen is added after deposition.

The first curve 402 has an approximately constant concentration regardless of the distance from the upper surface of the passive cap. Hence, the concentration of hydrogen in the passive cap corresponding to the first curve 402 is approximately uniform throughout the entire thickness of the passive cap. The second curve 404 has a concentration that decreases as the distance from the upper surface increases. Hence, the concentration of hydrogen in the passive cap corresponding to the second curve 404 is higher towards a top of the passive cap, and lower towards a bottom of the passive cap. In some embodiments, an average concentration of hydrogen in the passive cap corresponding to the first curve 402 is approximately equal to that in the passive cap corresponding to the second curve 404.

FIGS. 5-13 illustrate a series of cross-sectional views 500-1300 of some embodiments of a method for forming a semiconductor device in which a passive cap comprises silicon nitride and hydrogen and has opposing sidewalls at a boundary of a semiconductor layer inset into a substrate.

Figure 5:
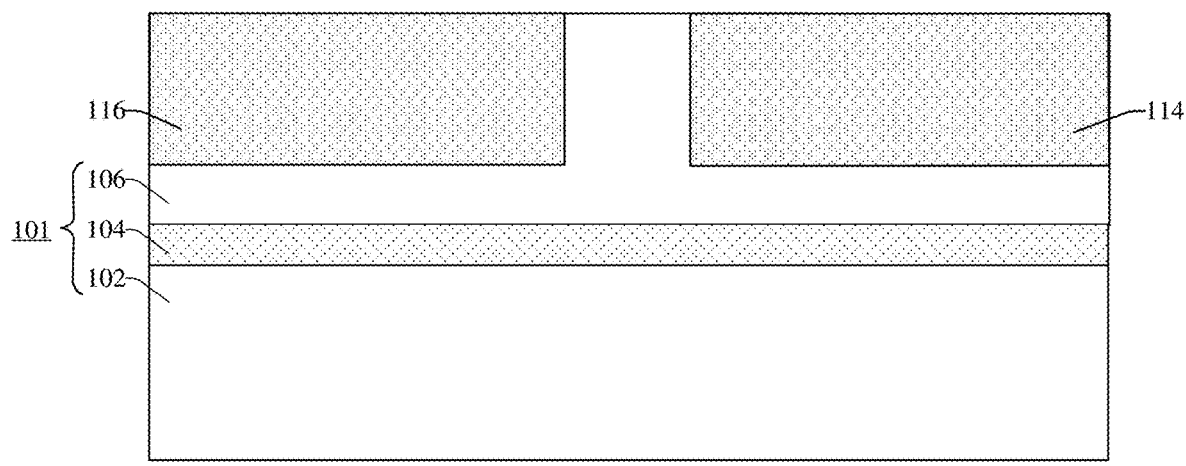
FIGS. 5-13 illustrate a series of cross-sectional views of some embodiments of a method for forming a semiconductor device in which a passive cap comprises silicon nitride and hydrogen and has opposing sidewalls at a boundary of a semiconductor layer inset into a substrate.

As illustrated by cross-sectional view 500 of FIG. 5, a substrate 101 is provided. In some embodiments, the substrate 101 is an SOI substrate and the entire SOI substrate is provided. In alternative embodiments, an insulating layer 104 is formed over a first semiconductor layer 102, and a second semiconductor layer 106 is formed over the insulating layer 104. In some embodiments, the process for forming the insulating layer 104 and the second semiconductor layer 106 comprises depositing the insulating layer 104 and the second semiconductor layer 106 using a deposition process such as physical vapor deposition (PVD), chemical vapor deposition (CVD), atomic layer deposition (ALD), or the like.

A p-type drift well 114 is formed into the substrate 101. A process for forming the p-type drift well 114 may comprise performing a doping process on the substrate 101 that comprises, for example, implanting p-type dopants (e.g., boron (B), gallium (Ga), etc.) into an upper surface of the substrate 101. An n-type drift well 116 is formed into the substrate 101. In some embodiments, the n-type drift well 116 is formed to be laterally separated from the p-type drift well 114 by an undoped portion of the substrate 101. A process for forming the n-type drift well 116 may comprise performing a doping process on the substrate 101 that comprises, for example, implanting n-type dopants (e.g., phosphorus (P), arsenic (As), etc.) into the upper surface of the substrate 101. In some embodiments, the p-type drift well 114 and the n-type drift well 116 are formed in the second semiconductor layer 106.

Figure 6:
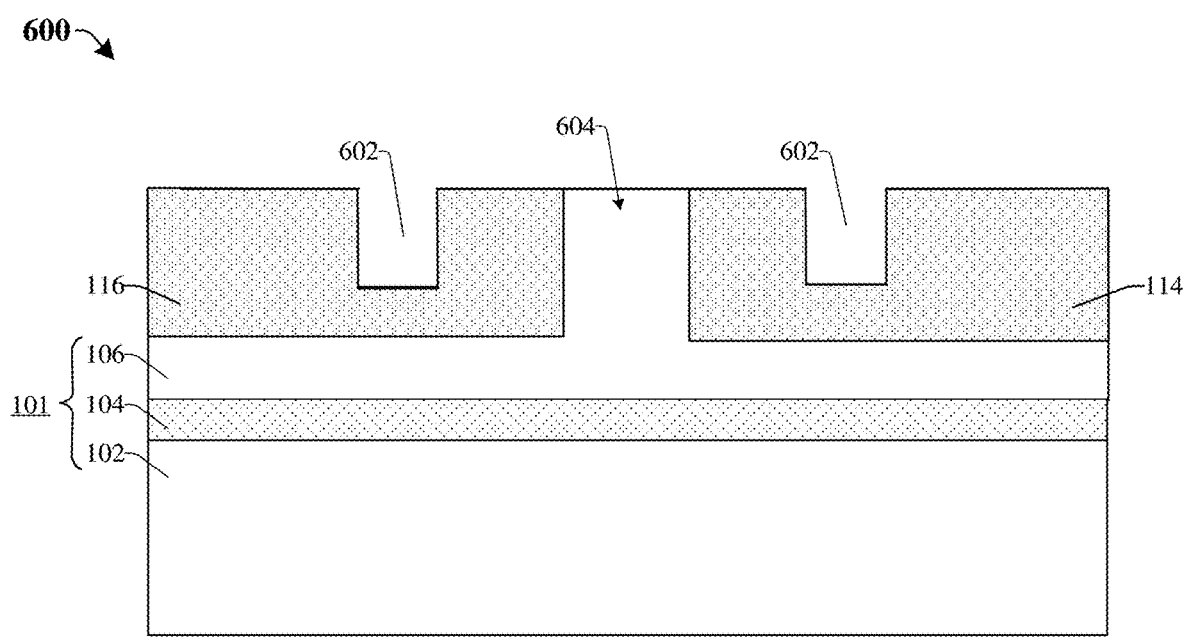

As illustrated by cross-sectional view 600 of FIG. 6, a plurality of shallow trenches 602 is etched into the substrate 101 surrounding an active region 604 in the substrate 101. In some embodiments, a process for etching the plurality of shallow trenches 602 into the substrate 101 comprises forming a masking structure over the substrate 101, etching the substrate 101 according to the masking structure, and subsequently removing the masking structure. In some embodiments, the process for etching the plurality of shallow trenches 602 partially etches the p-type drift well 114 and the n-type drift well 116. In some embodiments, the plurality of shallow trenches 602 may be etched by, for example, a dry etch process, a wet etch process, or the like.

Figure 7:
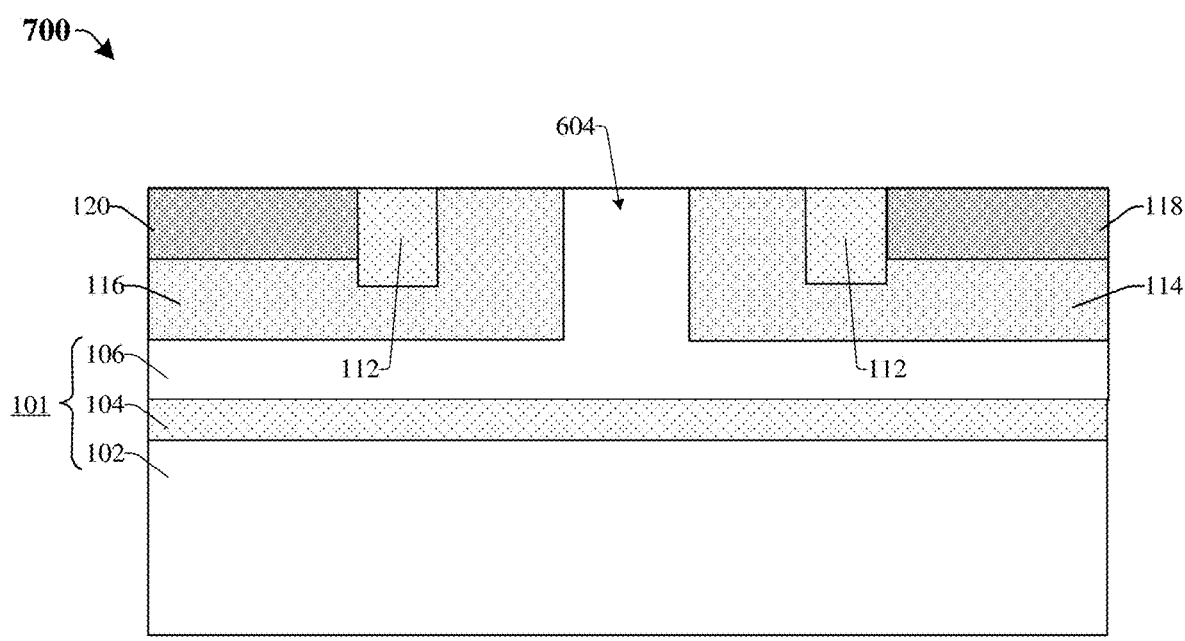

As illustrated by cross-sectional view 700 of FIG. 7, a shallow trench isolation (STI) structure 112 is formed in the shallow trenches 602. In some embodiments, a process for forming the STI structure 112 comprises, for example, depositing the STI structure 112 into the shallow trenches 602 using a deposition process such as CVD, PVD, ALD, or the like. In some embodiments, the STI structure 112 is also formed over the substrate 101 and is subsequently removed afterwards by way of a planarization process (e.g., chemical mechanical planarization (CMP), grinding, or the like).

A p+ contact region 118 and an n+ contact region 120 are subsequently formed into the substrate 101 respectively on opposing sides of the STI structure 112. A process for forming the p+ contact region 118 may comprise performing a doping process on the substrate 101 that comprises, for example, implanting p-type dopants into the upper surface of the substrate 101. The p+ contact region 118 is formed such that a concentration of p-type dopants in the p+ contact region 118 is greater than in the p-type drift well 114. A process for forming the n+ contact region 120 may comprise performing a doping process on the substrate 101 that comprises, for example, implanting n-type dopants into the upper surface of the substrate 101. The n+ contact region 120 is formed such that a concentration of n-type dopants in the n+ contact region 120 is greater than in the n-type drift well 116. In some embodiments, the p+ contact region 118 and the n+ contact region 120 are formed such that the p-type drift well 114 and the n-type drift well 116 extend further into the substrate 101 than the p+ contact region 118 and the n+ contact region 120, respectively.

Figure 8:
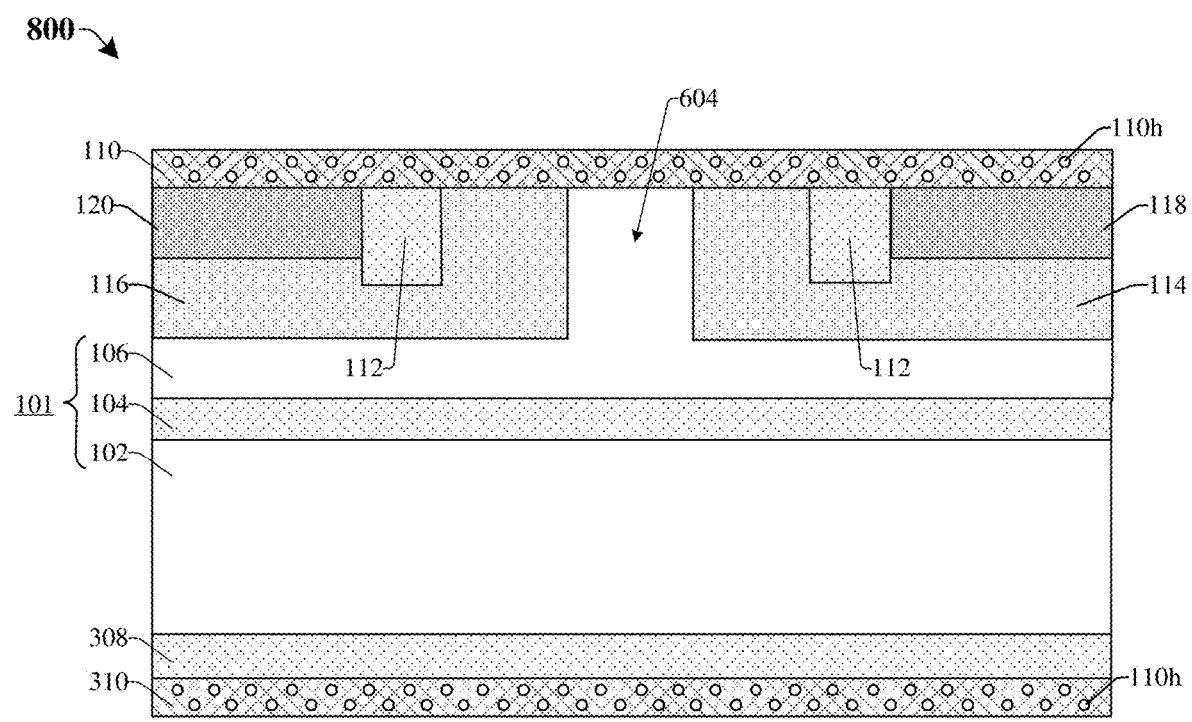

As illustrated by cross-sectional view 800 of FIG. 8, a first backside insulating layer 308 is formed below the substrate 101. In some embodiments, the first backside insulating layer 308 is formed along a bottom surface of the substrate 101. In some embodiments, a process for forming the first backside insulating layer 308 may comprise, for example, epitaxially growing the first backside insulating layer 308 or depositing the first backside insulating layer 308 using a deposition process such as PVD, CVD, ALD, or the like. In some embodiments, the first backside insulator layer 308 and the STI structure 112 are concurrently deposited, whereby the first backside insulator layer 308 and the STI structure 112 are a same material.

A passive cap 110 is formed over the substrate 101 and a second backside insulating layer 310 is formed below the first backside insulating layer 308. The passive cap 110 comprises a different material than the insulating layer 104. In some embodiments, the passive cap 110 may be or comprise, for example, silicon nitride, and the insulating layer 104 may be or comprise, for example, silicon dioxide or some other suitable oxide material. Since the passive cap 110 comprises silicon nitride, the passive cap 110 is not a source of oxygen and does not contaminate a subsequently formed semiconductor layer during fabrication of the semiconductor device, thereby decreasing leakage current and improving the performance of the semiconductor device as compared to a semiconductor device having a passive cap comprising an oxide. However, silicon nitride does not have a high level of growth suppression in comparison to alternative passive cap materials (e.g., silicon dioxide). During fabrication, a co-flow etch process may be performed while forming a subsequently formed semiconductor layer to remove excess semiconductor material of the semiconductor layer. To perform the co-flow etch process at a sufficiently low rate, such that excess semiconductor material of the semiconductor layer 108 from the passive cap 110 is removed without negatively affecting throughput, the passive cap 110 further comprises hydrogen 110$h$. The materials of the passive cap 110 may correspondingly form stable bonds (e.g., Si—H bonds), giving the passive cap 110 a higher level of growth suppression in comparison to a passive cap comprising only silicon nitride. For example, to the extent that the semiconductor layer is germanium and the passive cap 110 is hydrogen-rich silicon nitride, the hydrogen-rich silicon nitride may suppress germanium nucleation on the passive cap 110 and may hence reduce germanium growth on the passive cap 110. In some embodiments, the material of the passive cap 110 has a smaller band gap than the material of the insulating layer 104. In some embodiments, the material of the passive cap 110 has a larger dielectric constant than the material of the insulating layer 104.

In some embodiments, an atomic percentage of hydrogen 110$h$ in the passive cap 110 is greater than about 10% or some other suitable value. In some embodiments, if the atomic percentage of hydrogen 110$h$ in the passive cap 110 is too low (e.g., less than about 10%), the semiconductor material of the subsequently formed semiconductor layer may be at least partially deposited onto the passive cap 110 during fabrication of the semiconductor device, which may potentially lead to electrical shorting and/or leakage between neighboring photodetectors. Alternatively, the co-flow etch process may be performed at a sufficiently high rate so as to remove the semiconductor material of the semiconductor layer, although this may negatively affect throughput. In some embodiments, a concentration of hydrogen 110$h$ in the passive cap 110 increases from a bottom surface of the passive cap 110 to a top surface of the passive cap 110. In other embodiments, the concentration of hydrogen 110h in the passive cap 110 is constant throughout a thickness of the passive cap 110.

In some embodiments, a process for forming the passive cap 110 may comprise, for example, depositing the passive cap 110 using a deposition process such as plasma-enhanced chemical vapor deposition (PECVD), low-pressure chemical vapor deposition (LPCVD), or the like. In some embodiments, the hydrogen 110h of the passive cap 110 is added in during the deposition process. In other embodiments, the hydrogen 110h may be added to the passive cap 110 after the deposition process.

In some embodiments in which the deposition process is PECVD, the deposition process is performed at a temperature ranging from approximately 200 degrees Celsius to approximately 400 degrees Celsius, approximately 200 degrees Celsius to approximately 300 degrees Celsius, approximately 300 degrees Celsius to approximately 400 degrees Celsius, or some other suitable value. In some embodiments in which the deposition process is PECVD, a ratio of silicon to nitride in the passive cap 110 may range from approximately 0.8 to approximately 1.2, approximately 0.8 to approximately 1.0, approximately 1.0 to approximately 1.2, or some other suitable value. In some embodiments in which the deposition process is PECVD, the atomic percentage of hydrogen 110h in the passive cap 110 ranges from approximately 20% to approximately 30%, approximately 20% to approximately 25%, approximately 25% to approximately 30%, or some other suitable value.

In embodiments in which the deposition process is LPCVD, the deposition process is performed using dichlorosilane (e.g., DCS) or hexachlorodisilane (e.g., HCD) as a precursor. In some embodiments in which hexachlorodisilane (e.g., HCD) is used as a precursor during LPCVD, the deposition process is performed at a temperature of less than approximately 600 degrees Celsius, less than approximately 530 degrees Celsius, or some other suitable value. In some embodiments in which hexachlorodisilane (e.g., HCD) is used as a precursor, a ratio of silicon to nitride in the passive cap 110 may range from approximately 0.8 to approximately 1.2, approximately 0.8 to approximately 1.0, approximately 1.0 to approximately 1.2, or some other suitable value. In some embodiments in which hexachlorodisilane (e.g., HCD) is used as a precursor, the atomic percentage of hydrogen 110h in the passive cap 110 ranges from approximately 10% to approximately 30%, approximately 10% to approximately 20%, approximately 20% to approximately 30%, or some other suitable value. In embodiments in which the deposition process is PECVD or LPCVD using a hexachlorodisilane (e.g., HCD) precursor, since the atomic percentage of hydrogen 110h in the passive cap is sufficiently high (e.g., greater than about 10%), the passive cap 110 has a higher level of growth suppression in comparison to a passive cap that omits hydrogen. By suppressing growth of the subsequently formed semiconductor layer atop the passive cap 110, leakage current and/or electrical shorting from the subsequently formed photodetector to neighboring photodetectors may be reduced and/or prevented without negatively affecting throughput.

In some embodiments in which dichlorosilane (e.g., DCS) is used as a precursor during LPCVD, the deposition process is performed at a temperature ranging from approximately 630 degrees Celsius and approximately 800 degrees Celsius, approximately 700 degrees Celsius and approximately 800 degrees Celsius, approximately 630 degrees Celsius and approximately 780 degrees Celsius, or some other suitable value. In some embodiments in which dichlorosilane (e.g., DCS) is used as a precursor, a ratio of silicon to nitride in the passive cap 110 may be less than approximately 0.8, approximately 0.75, or some other suitable value. In some embodiments in which dichlorosilane (e.g., DCS) is used as a precursor, the atomic percentage of hydrogen 110h in the passive cap 110 ranges from approximately 4% to approximately 8%, approximately 4% to approximately 6%, approximately 6% to approximately 8%, or some other suitable value. In some embodiments, since the atomic percentage of hydrogen 110h in the passive cap 110 is too low (e.g., less than about 10%), the semiconductor material of the subsequently formed semiconductor layer may be at least partially deposited onto the passive cap 110 during fabrication of the semiconductor device, which may potentially lead to electrical shorting and/or leakage between neighboring photodetectors. Alternatively, the co-flow etch process may be performed at a sufficiently high rate, such that the subsequently formed semiconductor layer is removed from the passive cap 110. However, in such embodiments, throughput may be negatively affected. Thus, in embodiments in which the deposition process is LPCVD, hexachlorodisilane (e.g., HCD) is a more preferable precursor than dichlorosilane (e.g., DCS). However, while not preferable, dichlorosilane (e.g., DCS) is still feasible, so long as the co-flow etch process is subsequently performed at a sufficiently high rate such that the subsequently formed semiconductor layer is removed from the passive cap 110.

Hence, the semiconductor material of the subsequently formed semiconductor layer may be at least partially deposited onto the passive cap 110 during fabrication of the semiconductor device, which may potentially lead to electrical shorting and/or leakage between neighboring photodetectors. In some embodiments, the passive cap 110 and the second backside insulating layer 310 are formed simultaneously by a same process, such that the second backside insulating layer 310 also comprises hydrogen 110h. In some embodiments, an annealing process is performed after forming the passive cap 110 to tune a concentration of hydrogen in the passive cap 110. In some embodiments, the annealing process may be performed with an ambient gas comprising hydrogen (e.g., hydrogen gas ($H_2$)) to introduce hydrogen into the passive cap 110. In some embodiments, the annealing process may be performed with a different ambient gas (e.g., argon gas (Ar), nitrogen gas ($N_2$), or the like) to remove hydrogen from the passive cap 110. In some embodiments, the annealing process may be performed for both crystalline repair and for tuning a concentration of hydrogen in the passive cap 110. In alternative embodiments, the annealing process may be performed exclusively to introduce hydrogen to the passive cap 110 or remove hydrogen from the passive cap 110.

Figure 9:
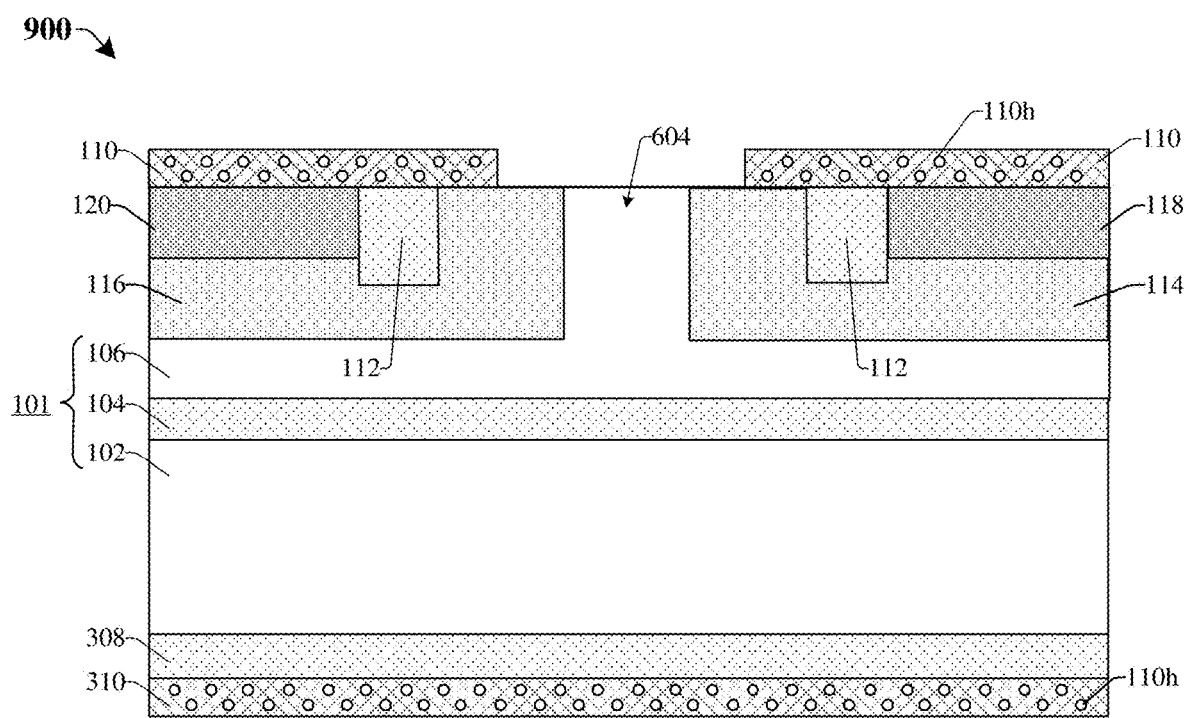

As illustrated by cross-sectional view 900 of FIG. 9, the passive cap 110 is etched to expose a portion of the upper surface of the substrate 101. In some embodiments, the passive cap 110 may be etched by, for example, a dry etch process, a wet etch process, or the like.

Figure 10:
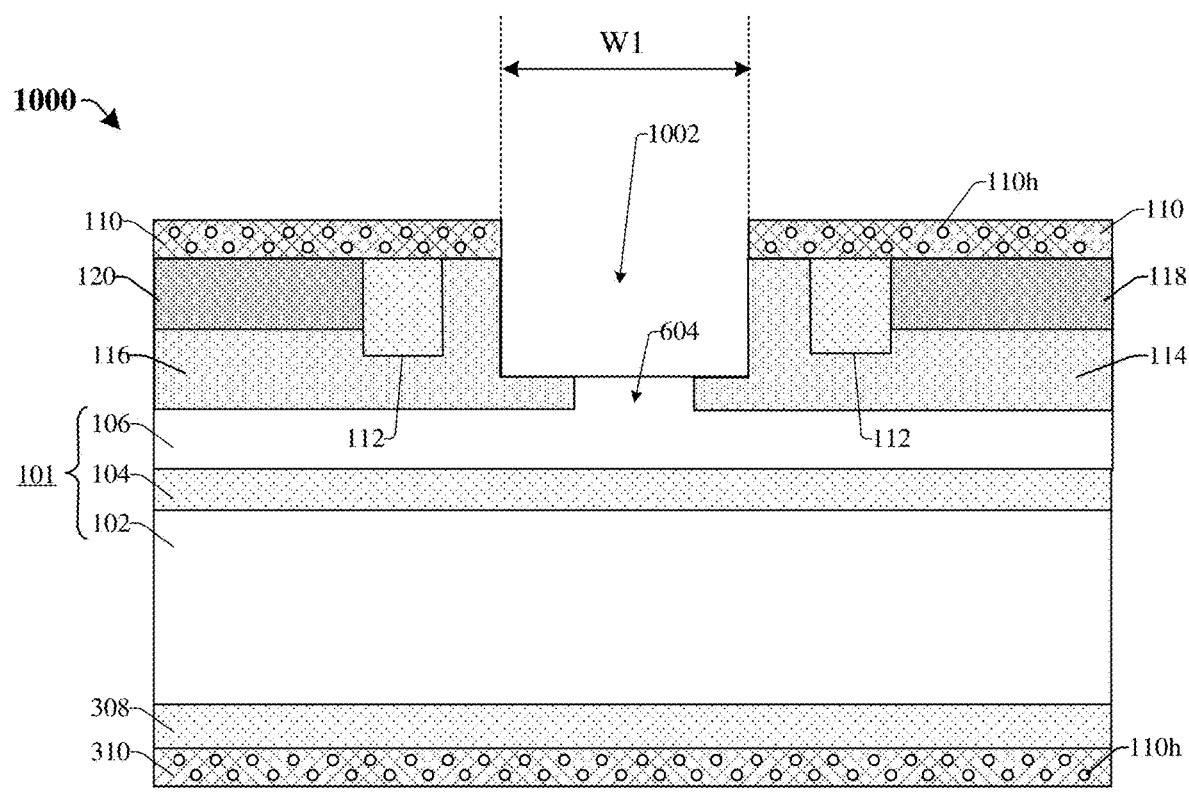

As illustrated by cross-sectional view 1000 of FIG. 10, a trench 1002 is formed into the substrate 101 extending from the exposed portion of the upper surface of the substrate 101 into the active region 604 of the substrate 101. In some embodiments, the trench 1002 may be etched by, for example, a dry etch process, a wet etch process, or the like. In some embodiments, the trench 1002 is formed to have a width W1 ranging from approximately 0.5 micrometers to approximately 15 micrometers, from approximately 0.5 micrometers to approximately 5 micrometers, from approximately 5 micrometers to approximately 15 micrometers, or some other suitable value.

Figure 11:
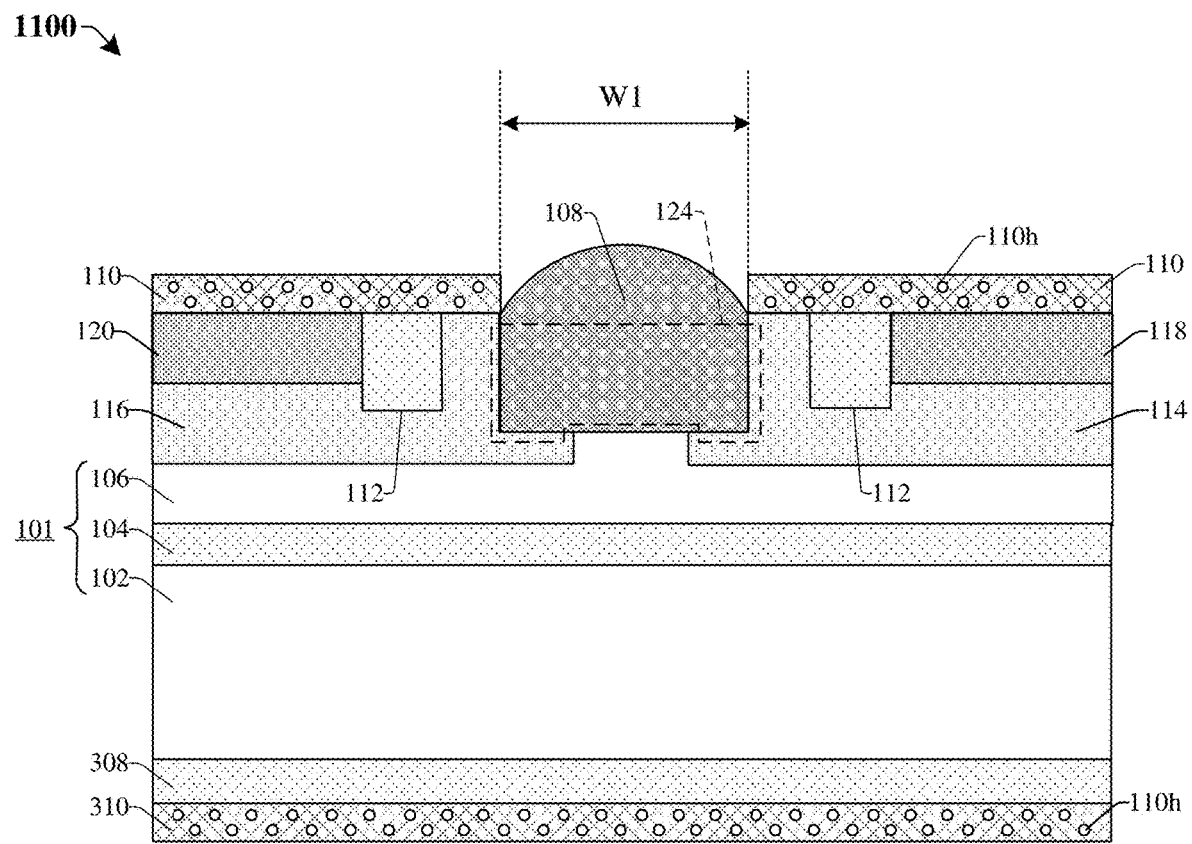

As illustrated by cross-sectional view 1100 of FIG. 11, a semiconductor layer 108 is deposited in the trench 1002. The p-type drift well 114, the semiconductor layer 108, and the n-type drift well 116 may collectively define or surround a photodetector 124. In some embodiments, the photodetector 124 may be, for example, a p-i-n photodiode or some other suitable photodetector (e.g., a p-n photodiode, an avalanche photodiode, or the like). A co-flow etch process is performed simultaneously with the deposition process to remove semiconductor material of the semiconductor layer 108 from the passive cap 110. In other words, the semiconductor layer 108 is selectively grown in the trench 1002. Hydrogen 110*h* in the passive cap 110 suppresses the rate of growth of the semiconductor material of the semiconductor layer 108 on the passive cap 110. Thus, the co-flow etch process can be performed at a sufficiently low rate such that excess semiconductor material of the semiconductor layer 108 from the passive cap 110 is removed without negatively affecting throughput.

In some embodiments, a process for forming the semiconductor layer 108 may comprise, for example, epitaxially growing the semiconductor layer 108 or depositing the semiconductor layer 108 using a deposition process such as PVD, CVD, ALD, or the like. In some embodiments, the semiconductor layer 108 is formed to be or comprise, for example, germanium or some other suitable semiconductor material(s) having a larger bandgap than the second semiconductor layer 106 of the substrate 101. In some embodiments, the semiconductor layer 108 is formed to have a curved upper surface. In some embodiments, the curved upper surface extends over the upper surface of the substrate 101. In alternative embodiments, the curved upper surface extends under the upper surface of the substrate 101. In alternative embodiments, the passive cap 110 may be removed after forming the semiconductor layer 108.

The co-flow etch process uses an etchant such as, for example, hydrochloric acid (e.g., HCl) or the like. In some embodiments in which the passive cap 110 is formed by PECVD or in which the passive cap 110 is formed by LPCVD using a hexachlorodisilane (e.g., HCD) precursor, since such processes cause the passive cap 110 to have a sufficiently high atomic percentage of hydrogen 110*h* (e.g., greater than approximately 10%), the co-flow etch process is performed at a rate of less than or equal to approximately 100 standard cubic centimeters per minute (SCCM) or some other suitable value.

In some embodiments in which the passive cap 110 is formed by LPCVD using a dichlorosilane (e.g., DCS) precursor, since such a process causes the passive cap 110 to have too low of an atomic percentage of hydrogen 110*h* (e.g., less than approximately 10%), the co-flow etch process is performed at a rate of greater than or equal to approximately 175 SCCM, greater than approximately 200 SCCM, or some other suitable value. In some embodiments, if the co-flow etch process is performed at too low of a rate (e.g., less than approximately 175 SCCM), the semiconductor layer 108 may at least partially deposit onto the passive cap 110, which may potentially lead to electrical shorting and/or leakage between neighboring photodetectors. Thus, so long as the co-flow etch process is performed at a sufficiently high rate, the passive cap 110 may not comprise hydrogen 110*h*. However, if the co-flow etch process is performed at a higher rate, throughput is lower, meaning that it is preferable for the passive cap 110 to comprise a sufficient amount of hydrogen 110*h* (e.g., an atomic percentage of greater than about 10%) so as to avoid performing the co-flow etch process at too high of a rate (e.g., greater than about 150 SCCM). In some embodiments in which the co-flow etch process is performed at a rate of greater than approximately 100 SCCM, a top surface of the semiconductor layer 108 may be concave as shown in, for example, FIGS. 2A-2B. In some of such embodiments, the higher the rate at which the co-flow etch process is performed, the lower the throughput.

Figure 12:
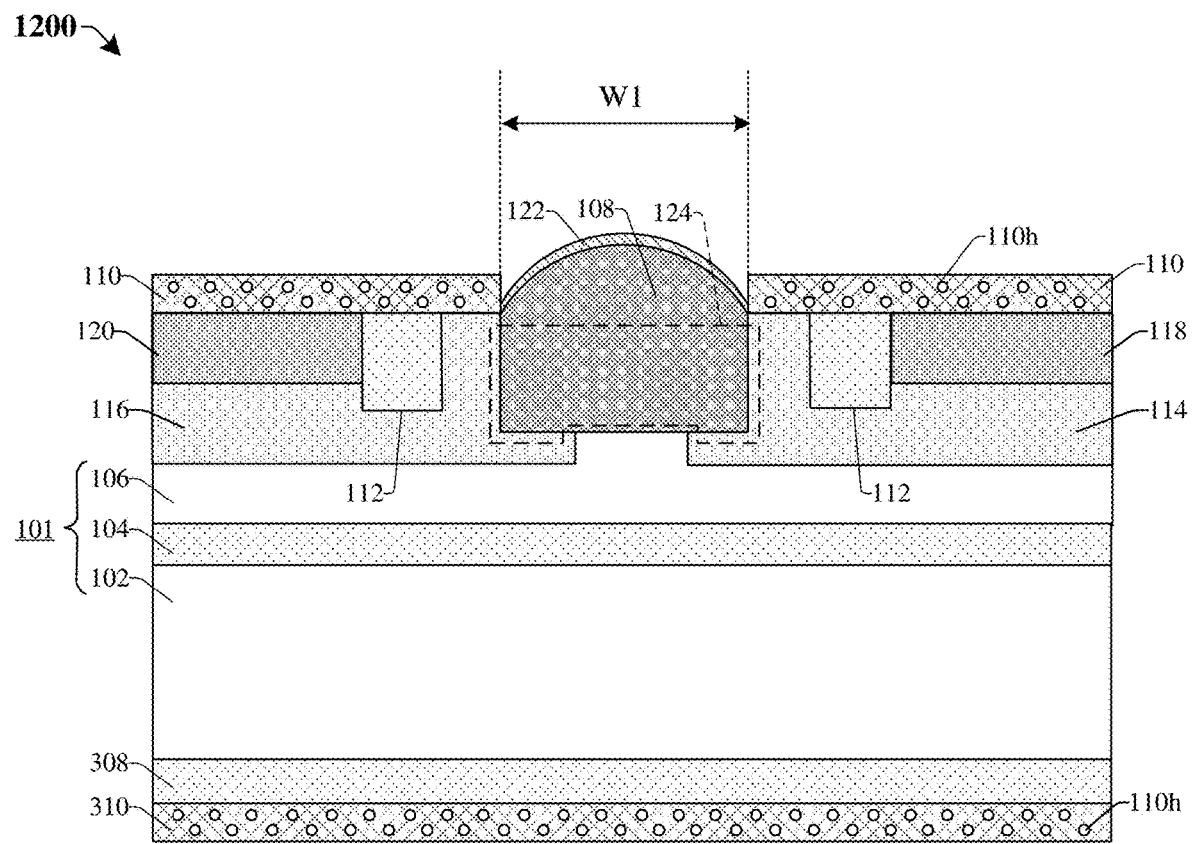

As illustrated by cross-sectional view 1200 of FIG. 12, a capping layer 122 is formed over the semiconductor layer 108 to protect the semiconductor layer 108 during subsequent processing. In some embodiments, a process for forming the capping layer 122 may comprise, for example, performing a blanket deposition of the capping layer 122 using a deposition process such as PVD, CVD, ALD, or the like and subsequently performing an etch. In some embodiments, the capping layer 122 may be selectively grown to prevent the capping layer 122 from being deposited on the passive cap 110.

Figure 13:
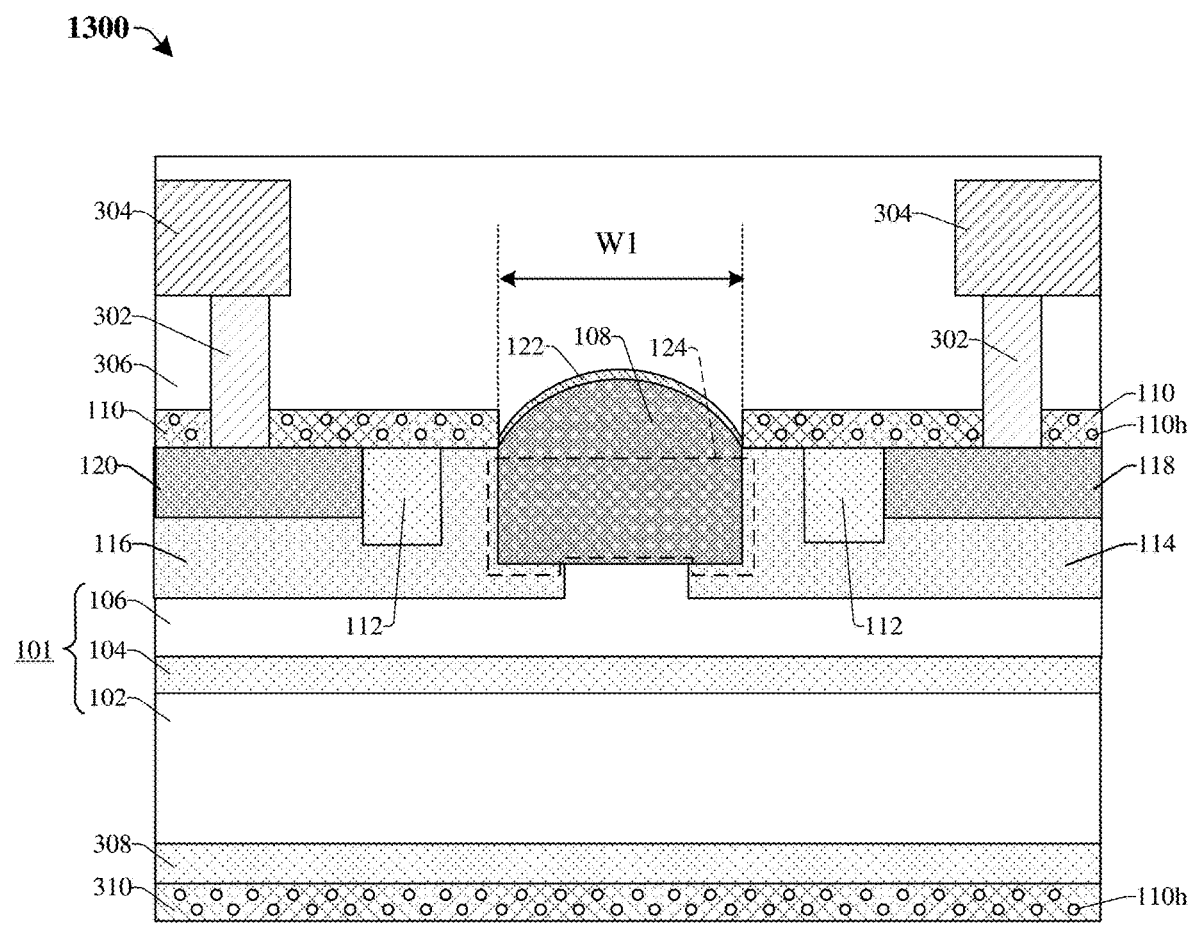

As illustrated by cross-sectional view 1300 of FIG. 13, an interconnect dielectric structure 306 is formed over the substrate 101, the STI structure 112, the semiconductor layer 108, the passive cap 110, and the capping layer 122. A process for forming the interconnect dielectric structure 306 comprises, for example, depositing one or more stacked interlayer dielectric (ILD) layers and intermetal dielectric (IMD) layers over the substrate 101 using a deposition process such as PVD, CVD, ALD, or the like.

A plurality of conductive contacts 302 (e.g., metal contacts) and a plurality of conductive lines 304 (e.g., metal lines) are formed in the interconnect dielectric structure 306. In some embodiments, the conductive contacts 302 and the conductive lines 304 are part of an interconnect structure embedded in the interconnect dielectric structure 306. Although not shown, it will be appreciated that any number of other conductive features (e.g., conductive lines and conductive vias) may be formed over and electrically coupled to the conductive contacts 302 and the conductive lines 304.

The conductive contacts 302 are formed to extend vertically from the substrate 101 to the conductive lines 304, providing a path on which the photocurrent may travel from the substrate 101 to the conductive lines 304. For example, a first conductive contact of the conductive contacts 302 is formed to extend vertically from the p+ contact region 118 to a first conductive line of the conductive lines 304, and a second conductive contact of the conductive contacts 302 is formed to extend vertically from the n+ contact region 120 to a second conductive line of the conductive lines 304. In some embodiments, a process for forming the plurality of conductive contacts 302 and the plurality of conductive lines 304 comprises, for example, depositing the plurality of conductive contacts 302 and the plurality of conductive lines 304 using a deposition process such as PVD, CVD, ALD, sputtering, electroplating, or the like.

Figure 14:
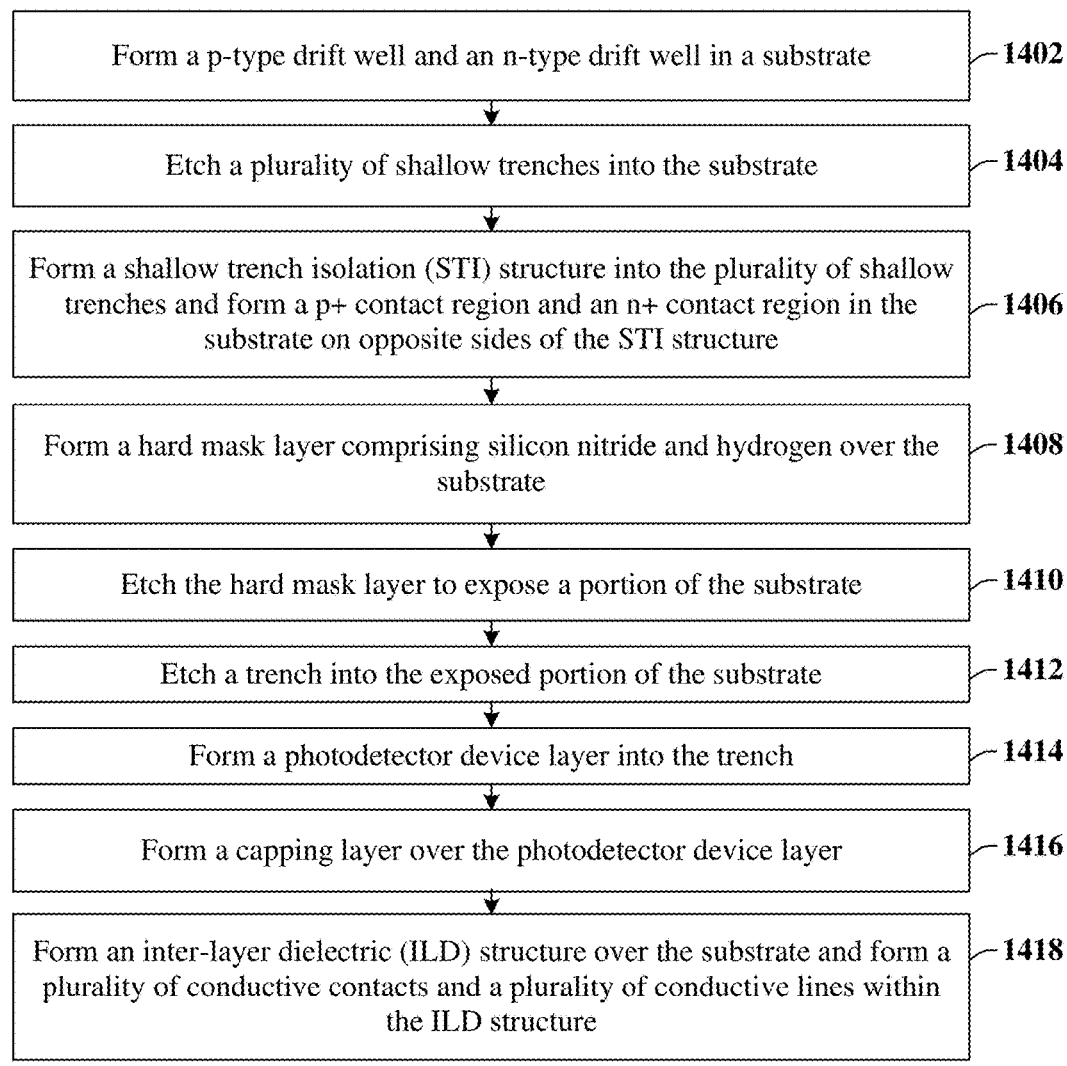
FIG. 14 illustrates a flowchart of some embodiments of a method for forming a semiconductor device in which a passive cap comprises silicon nitride and hydrogen and has opposing sidewalls at a boundary of a semiconductor layer inset into a substrate.

FIG. 14 illustrates a flowchart 1400 of some embodiments of a method for forming a semiconductor device in which a passive cap comprises silicon nitride and hydrogen and has opposing sidewalls at a boundary of a semiconductor layer inset into a substrate.

While the disclosed flowchart 1400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1402, a p-type drift well and an n-type drift well are formed in a substrate. See, for example, FIG. 5.

At act 1404, a plurality of shallow trenches is etched into the substrate. See, for example, FIG. 6.

At act 1406, a shallow trench isolation (STI) structure is formed into the plurality of shallow trenches, and a p+ contact region and an n+ contact region are formed in the substrate on opposing sides of the STI structure. See, for example, FIG. 7.

At act 1408, a passive cap comprising silicon nitride and hydrogen is formed over the substrate. See, for example, FIG. 8.

At act 1410, the passive cap is etched to expose a portion of the substrate. See, for example, FIG. 9.

At act 1412, a trench is etched into the exposed portion of the substrate. See, for example, FIG. 10.

At act 1414, a semiconductor layer is formed into the trench. See, for example, FIG. 11.

At act 1416, a capping layer is formed over the semiconductor layer. See, for example, FIG. 12.

At act 1418, an interconnect dielectric structure is formed over the substrate and a plurality of conductive contacts and a plurality of conductive lines are formed within the interconnect dielectric structure. See, for example, FIG. 13.

Accordingly, in some embodiments, the present disclosure relates to semiconductor device, including a substrate including a first semiconductor material, a semiconductor layer extending into an upper surface of the substrate and including a second semiconductor material with a different band gap than the first semiconductor material, a passive cap including a first dielectric material and disposed along the upper surface of the substrate and on opposite sides of the semiconductor layer, the first dielectric material including silicon nitride, a first doped region having a first doping type disposed in the substrate, and a second doped region having a second doping type opposite the first doping type disposed in the substrate and separated from the first doped region by the semiconductor layer.

In other embodiments, the present disclosure relates to a semiconductor device, including a silicon-on-insulator (SOI) substrate, a semiconductor layer extending into an upper surface of the SOI substrate and including germanium, a passive cap having a pair of opposing sidewalls respectively on opposite sides of the semiconductor layer and at a boundary of the semiconductor layer, and a photodetector defined by the semiconductor layer and doped regions of the SOI substrate. The passive cap has a smaller band gap than an insulating layer of the SOI substrate.

In yet other embodiments, the present disclosure relates to a method for forming a semiconductor device, including providing a silicon-on-insulator (SOI) substrate, depositing a passive cap over the SOI substrate, the passive cap having a larger dielectric constant than an insulating layer of the SOI substrate, etching the SOI substrate according to the passive cap to form a trench extending from an upper surface of the SOI substrate into an active region of the SOI substrate, and depositing a semiconductor layer to fill the trench. The semiconductor layer includes a semiconductor material with a larger bandgap than silicon of the SOI substrate and partially forms a photodetector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    providing a silicon-on-insulator (SOI) substrate;
    forming an N-type drift region and a P-type drift region spaced from each other and in the SOI substrate;
    forming an N-type contact region and a P-type contact region inset respectively into the N-type and P-type drift regions;
    depositing a passive cap over the SOI substrate, the passive cap having a larger dielectric constant than an insulating layer of the SOI substrate, wherein the passive cap overlies and directly contacts individual top surfaces of the N-type and P-type contact regions and individual top surfaces of the N-type and P-type drift regions;
    etching the SOI substrate according to the passive cap to form a trench extending from an upper surface of the SOI substrate into an active region of the SOI substrate, wherein the trench exposes individual sidewalls of the N-type and P-type drift regions, only partially overlies the N-type and P-type drift regions, and is spaced from the N-type and P-type contact regions respectively by the N-type and P-type drift regions; and
    depositing a semiconductor layer to fill the trench, wherein the semiconductor layer comprises a semiconductor material of a different type than silicon of the SOI substrate and partially forms a photodetector;
    wherein the depositing of the passive cap comprises performing a low-pressure chemical vapor deposition (LPCVD) using a precursor comprising hexachlorodisilane (HCD), wherein the passive cap comprises hydrogen, and wherein an atomic percentage of hydrogen in the passive cap is greater than approximately 10%.

2. The method of claim 1, further comprising:
    etching a plurality of shallow trenches that surround the active region in the SOI substrate prior to depositing the passive cap; and
    depositing a shallow trench isolation (STI) structure into the plurality of shallow trenches.

3. The method of claim 1, wherein the passive cap is removed after depositing the semiconductor layer.

4. The method according to claim 1, further comprising: forming a trench isolation structure having a pair of segments extending respectively into the N-type and P-type drift regions and contacting the passive cap, wherein the pair of segments are between the N-type and P-type contact regions and separate the N-type and P-type contact regions from the trench.

5. The method of claim 1, further comprising:
    performing an anneal after the depositing of the passive cap, wherein the anneal decreases a concentration of hydrogen in the passive cap.

6. The method of claim 1, further comprising:
forming a conductive line and a conductive contact over the SOI substrate, wherein the conductive contact extends from the conductive line, through the passive cap, to the SOI substrate.

7. A method, comprising:
providing a semiconductor-on-insulator (SOI) substrate comprising a first semiconductor layer, a dielectric layer overlying the first semiconductor layer, and a second semiconductor layer overlying the dielectric layer;
doping the second semiconductor layer to form an N-type drift region and a P-type drift region spaced from the dielectric layer and spaced from each other;
forming a hydrogen-rich silicon nitride layer covering the second semiconductor layer;
patterning the hydrogen-rich silicon nitride layer and the second semiconductor layer to form a trench extending through the hydrogen-rich silicon nitride layer into the second semiconductor layer, wherein the trench exposes individual sidewalls of the N-type and P-type drift regions and partially overlies the N-type and P-type drift regions;
depositing a germanium layer filling the trench; and
forming a conductive line and a conductive contact over the SOI substrate, wherein the conductive contact extends from the conductive line, through the hydrogen-rich silicon nitride layer, to the SOI substrate.

8. The method according to claim 7, further comprising:
etching the germanium layer concurrent with the depositing of the germanium layer, such that a top surface of the hydrogen-rich silicon nitride layer is clear of germanium at completion of the depositing of the germanium layer.

9. The method according to claim 7, further comprising:
performing an anneal after the forming of the hydrogen-rich silicon nitride layer, wherein the anneal decreases a concentration of hydrogen in the hydrogen-rich silicon nitride layer.

10. The method according to claim 7, further comprising:
forming a trench isolation structure having a pair of segments extending respectively into the N-type and P-type drift regions, wherein the trench is formed directly between the pair of segments; and
forming an N-type contact region and a P-type contact region respectively overlying the N-type and P-type drift regions, and outside an area directly between the pair of segments, after the forming of the trench isolation structure.

11. The method according to claim 10, wherein the N-type and P-type drift regions, the N-type and P-type contact regions, and the trench isolation structure have individual top surfaces that are level with each other and that contact the hydrogen-rich silicon nitride layer, and wherein each of the pair of segments laterally and contact a corresponding one of the N-type and P-type contact regions.

12. The method according to claim 11, further comprising:
depositing a capping layer overlying and contacting the germanium layer, wherein the capping layer is semiconductive and comprises a bottom surface and a top surface that both are continuously from a first sidewall of the hydrogen-rich silicon nitride layer to a second sidewall of the hydrogen-rich silicon nitride layer on an opposite side of the trench as the first sidewall, and wherein a vertical separation between the bottom and top surfaces of the capping layer decreases continuously from a width-wise center between the first and second sidewalls to the first and second sidewalls.

13. The method according to claim 7, further comprising:
forming an additional hydrogen-rich silicon nitride layer on the first semiconductor layer, separated from the second semiconductor layer by the dielectric layer and the first semiconductor layer.

14. A method, comprising:
providing a semiconductor substrate;
forming a trench isolation structure having a pair of isolation segments extending into the semiconductor substrate;
forming a doped nitride layer covering and directly contacting the semiconductor substrate and the trench isolation structure;
performing a first etch into the doped nitride layer and the semiconductor substrate to form a trench between and spaced from the pair of isolation segments, wherein the semiconductor substrate has a semiconductor surface recessed relative to a bottom surface of the trench isolation structure and facing an opposite direction as the bottom surface of the trench isolation structure in the trench at completion of the first etch;
depositing a semiconductor layer filling the trench, wherein the semiconductor layer has a different material composition than the semiconductor substrate; and
performing a second etch into the semiconductor layer while performing the depositing to clear material of the semiconductor layer from the doped nitride layer;
wherein the semiconductor layer and a portion of the semiconductor substrate form a photodetector.

15. The method according to claim 14, wherein the semiconductor substrate is a silicon-on-insulator (SOI) substrate, and wherein the doped nitride layer is doped with hydrogen and has a higher dielectric constant than a dielectric insulator of the semiconductor substrate.

16. The method according to claim 14, wherein the forming of the doped nitride layer comprises:
depositing a nitride layer covering the semiconductor substrate; and
doping the nitride layer with hydrogen after depositing the nitride layer.

17. The method according to claim 14, wherein the semiconductor layer has, at completion of the depositing, a curved top surface in which a width-wise center of the curved top surface is elevated relative to a top surface of the doped nitride layer and in which edges of the curved top surface are recessed relative to the top surface of the doped nitride layer.

18. The method according to claim 14, wherein the doped nitride layer is formed on a frontside of the semiconductor substrate, opposite a backside of the semiconductor substrate, and wherein the method further comprises:
forming a backside dielectric layer on the backside of the semiconductor substrate; and
forming an additional doped nitride layer on the backside of the semiconductor substrate, separated from the semiconductor substrate by the backside dielectric layer.

19. The method according to claim 14, further comprising:
depositing a capping layer overlying and contacting the semiconductor layer, wherein the capping layer is a dielectric nitride or oxide and comprises a bottom surface that arcs continuously from a first sidewall of the doped nitride layer to a second sidewall of the doped nitride layer on an opposite side of the trench as the first sidewall, and wherein a thickness of the capping layer decreases continuously from a widthwise center between the first and second sidewalls to the first and second sidewalls.

20. The method according to claim 19, further comprising:
 forming an N-type drift region and a P-type drift region spaced from each other in the semiconductor substrate, wherein the trench extends into and partially overlies both of the N-type and P-type drift regions, and wherein the pair of isolation segments are formed extending respectively into the N-type and P-type drift regions; and
 forming an N-type contact region and a P-type contact region respectively overlying the N-type and P-type drift regions, and outside an area directly between the pair of isolation segments, after the forming of the trench isolation structure.

\* \* \* \* \*